(12) United States Patent
Bradley et al.

(10) Patent No.: US 8,327,715 B2
(45) Date of Patent: Dec. 11, 2012

(54) FORCE SENSOR APPARATUS

(75) Inventors: Alistair David Bradley, Dublin, OH (US); Todd Eckhardt, Westerville, OH (US); Ryan Jones, Dublin, OH (US); Richard Wade, Worthington, OH (US)

(73) Assignee: Honeywell International Inc., Morristown, NJ (US)

( * ) Notice: Subject to any disclaimer, the term of this patent is extended or adjusted under 35 U.S.C. 154(b) by 567 days.

(21) Appl. No.: 12/497,299

(22) Filed: Jul. 2, 2009

(65) Prior Publication Data
US 2011/0000318 A1    Jan. 6, 2011

(51) Int. Cl.
*G01B 7/16* (2006.01)
*G01L 1/00* (2006.01)

(52) U.S. Cl. ............................ 73/774; 73/777
(58) Field of Classification Search ............. 73/774–777
See application file for complete search history.

(56) References Cited

U.S. PATENT DOCUMENTS

| | | |
|---|---|---|
| 5,184,107 A | 2/1993 | Maurer |
| 5,187,985 A | 2/1993 | Nelson |
| 5,223,776 A | 6/1993 | Radke et al. |
| 5,303,593 A | 4/1994 | Kremidas |
| 5,661,245 A | 8/1997 | Svoboda et al. |
| 5,744,726 A | 4/1998 | Maurer |
| 5,760,313 A | 6/1998 | Guentner et al. |
| 5,996,419 A | 12/1999 | Sokn |
| 6,255,728 B1 | 7/2001 | Nasiri et al. |
| 6,311,561 B1 | 11/2001 | Bang et al. |
| 6,351,996 B1 | 3/2002 | Nasiri et al. |
| 6,401,545 B1 * | 6/2002 | Monk et al. .................... 73/756 |
| 6,481,286 B1 | 11/2002 | Bernstein et al. |
| 6,601,455 B2 | 8/2003 | Kurtz et al. |
| 6,705,166 B2 | 3/2004 | Leonardson |
| 6,712,778 B1 | 3/2004 | Jeffcoat et al. ................ 600/590 |
| 6,736,015 B1 | 5/2004 | Repperger et al. ............. 73/841 |
| 6,874,377 B2 | 4/2005 | Karbassi et al. |
| 6,907,789 B2 | 6/2005 | Bodin |

(Continued)

FOREIGN PATENT DOCUMENTS

EP    0091282    3/1983

(Continued)

OTHER PUBLICATIONS

U.S. Appl. No. 12/969,426, filed Dec. 15, 2010.

(Continued)

*Primary Examiner* — Lisa Caputo
*Assistant Examiner* — Jonathan Dunlap
(74) *Attorney, Agent, or Firm* — Seager Tufte & Wickhem LLC.

(57) ABSTRACT

A force sensor apparatus and method of forming the same. The apparatus includes a force sense element that can be attached to a substrate. An actuator disposed in a hole formed within the cap is operably coupled to the force sense element for transferring force to the sense element in response to receiving a force from an external source. The force sense element is configured to sense the external force and generate an output signal representing the force. Preferably, one or more bond pads, associated with the force sense element and the substrate, can be electrically connected via wire bonding. A cover associated with an integrated flexible membrane can be mounted on the substrate in order to protect internal components associated with the force sensor apparatus from an external environment.

22 Claims, 2 Drawing Sheets

U.S. PATENT DOCUMENTS

| | | |
|---|---|---|
| 7,287,432 B2 | 10/2007 | Schnaare et al. |
| 7,360,438 B2 * | 4/2008 | Gaines .......................... 73/774 |
| 7,404,338 B2 | 7/2008 | Hierold et al. ............. 73/862.68 |
| 7,462,919 B2 | 12/2008 | Engling et al. |
| 7,726,197 B2 * | 6/2010 | Selvan et al. ................... 73/777 |
| 7,775,126 B2 | 8/2010 | Eckhardt et al. |
| 7,775,127 B2 | 8/2010 | Wade |
| 7,880,247 B2 * | 2/2011 | Vaganov et al. ............... 257/415 |
| 2007/0251328 A1 * | 11/2007 | Selvan et al. ................... 73/777 |
| 2008/0010821 A1 * | 1/2008 | Padmanabhan et al. ... 73/204.26 |
| 2009/0078040 A1 * | 3/2009 | Ike et al. ..................... 73/204.26 |
| 2009/0211365 A1 * | 8/2009 | Morikawa et al. .............. 73/775 |
| 2009/0263062 A1 | 10/2009 | Smith et al. |
| 2011/0000313 A1 | 1/2011 | Eckhardt et al. |

FOREIGN PATENT DOCUMENTS

| | | | |
|---|---|---|---|
| EP | 0354366 | | 11/1992 |
| EP | 1519173 | | 3/2005 |
| EP | 1530028 | A1 * | 5/2005 |
| EP | 2110569 | | 10/2009 |
| JP | 63196080 | | 8/1988 |
| WO | 9919704 | | 4/1999 |
| WO | 0135066 | | 5/2001 |
| WO | 0165232 | | 9/2001 |
| WO | 02103369 | | 12/2002 |
| WO | 2005038422 | | 4/2005 |
| WO | 2007127738 | | 11/2007 |
| WO | 2010048040 | | 4/2010 |

OTHER PUBLICATIONS http://www.gesilicones.com/silicanesweb/am1/en/documentsdatasheets;1838.html, "Momentive Performance Materials," 5 pages, printed Nov. 19, 2008.

Honeywell, "Airflow, Force, and Pressure Sensors, Product Range Guide," 20 pages, Nov. 2010.

Honeywell, "Force Sensors Line Guide," 4 pages, Jun. 2009.

Honeywell, "Pressure Sensors FS01/FS03 Force Sensors," 4 pages, 2003.

Honeywell, "TruStability Silicon Pressure Sensors: HSC Series-High Accuracy," 12 pages, Jul. 2010.

Honeywell, "TruStability Silicon Pressure Sensors: SSC Series-Standard Accuracy," 12 pages, Jul. 2010.

* cited by examiner

FORCE SENSOR APPARATUS

TECHNICAL FIELD

Embodiments are generally related to force sensors. Embodiments are also related to force sense elements for use with force sensors. Embodiments are additionally related to methods for packaging force sensors.

BACKGROUND OF THE INVENTION

A force sensor measures an external force applied to a sense element and generates an output signal representative of the applied force. Such force sensors are commonly utilized in a wide variety of applications such as, for example, automotive, aerospace, medical, industrial, and consumer applications. The operational environments in which force sensors operate can be very demanding and typically require high accuracy, high repeatability, fast response time, and high reliability. Such force sensors can be utilized for measuring a very low force with a reliable accuracy.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide for an improved force sensor apparatus.

It is another aspect of the disclosed embodiments to provide for an improved force sensor configuration that includes a cap associated with an actuator and a force sense element.

It is a further aspect of the disclosed embodiments to provide for an improved method for packaging a force sensor apparatus.

The aforementioned aspects and other objectives and advantages can now be achieved as described herein. A force sensor apparatus and method of forming the same is disclosed. The apparatus includes a force sense element (e.g., piezoresistive silicon die) that can be attached to a substrate with the assistance of a die-attach material. An actuator (e.g., ball bearing) disposed in an opening associated with a cap can be operably coupled to the force sense element for transferring force to the sense element in response to receiving a force from an external source. The force sense element detects the external force and generates an output signal indicative of the force. Preferably, one or more bond pads, associated with the force sense element and the substrate, can be electrically connected, for example, via wire bonding.

The aforementioned hole associated with the cap generally restricts lateral movement of the actuator to ensure that contact is made with the force sense element in a repeatable location, thereby enabling a highly repeatable signal. Preferably, the cap can be configured with a height greater than the diameter of the actuator. Alternatively, the cap can be designed to be shorter which still reduces lateral movement of the actuator.

A cover associated with an integrated flexible membrane can be mounted on the substrate in order to protect internal components associated with the force sensor apparatus from an external environment. Additionally, the membrane in the cover assists in retaining the actuator and can be arranged to provide a small "pre-load" to further ensure repeatability, enable accurate operation with small loads, and also reduce mechanical impact on the sense element which can otherwise occur during heavy force cycling.

A signal conditioner, electrically coupled to the force sense element, can also be mounted on the substrate. The signal conditioner can condition the output signal and generate a calibrated output corrected for the effects of temperature and force sensitivity and non-linearity over the operating range. The force sense element and the signal conditioner can be electrically connected via wirebonds either directly or connected through the substrate. The actuator, acting through the hole associated with the cap, provides fast response time and a uniform application of force to the sense element.

Such a force sensor apparatus associated with the cap, wirebonds, and the cover provides flexibility in package design, fast response time, repeatable signal, and highly reliable mechanical and electrical connections.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

A force sensor can employ a force sense element, such as a piezoresistive silicon die, in combination with an actuator. The actuator can be arranged to press against the force sense element in response to an external force exerted against the actuator. The force sense element can include a flexible diaphragm which deflects in response to the actuator pressing on the force sense element. Deflection of the diaphragm may cause one or more piezoresistors disposed on or near the diaphragm to stress and change resistance. Electronic circuitry detects the change of resistance and determines the external force from the resistance change.

The disclosed embodiments generally involve singulated wafer portions. The use of such wafers and singulated wafer portions improves efficiencies by precisely fabricating such wafers, aligning the wafers, and then singulating such wafers into respective wafer portions. Such an approach is much more efficient than, for example, precisely machining and aligning individual components of a single sensor.

Figure 1:
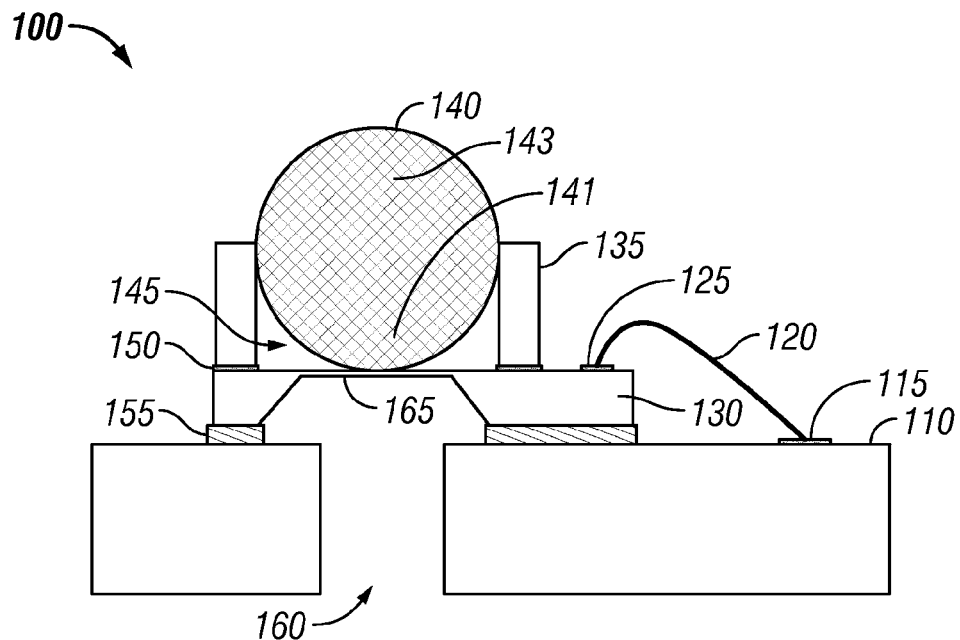
FIG. 1 illustrates a perspective view of a force sensor apparatus associated with a cap, in accordance with an embodiment.

FIG. 1 illustrates a perspective view of a force sensor apparatus 100 with a cap 135, in accordance with an embodiment. The force sensor apparatus 100 generally includes a substrate 110 associated with a gauge reference area 160. A singulated first wafer portion 130 is configured such that the wafer portion 130 constitutes a MEMS force sensing element. Note that as utilized herein, the reference numeral 130 may refer equally to the first singulated wafer portion and the MEMS force sensing element. The force sensor apparatus 100 generally includes an actuator 140 having a first region 141 adjacent the MEMS force sensing element 130 and a second region 143 that is opposite the first region 141.

Note also that as utilized herein, the acronym MEMS generally refers to "Microelectromechanical System" type devices, manufacturing and processing techniques, and components. Microelectromechanical systems (MEMS) (also written as micro-electro-mechanical, or MicroElectroMechanical) is the technology of the very small and merges at the nano-scale into nanoelectromechanical systems (NEMS) and nanotechnology. MEMS are also referred to as micromachines (in Japan), or Micro Systems Technology—MST (in Europe). MEMS are typically configured of components between 1 to 100 micrometers in size (i.e. 0.001 to 0.1 mm) and MEMS devices generally range in size from 20 micrometers (20 millionths of a meter) to a millimeter.

The force sensor apparatus 100 also includes a singulated second wafer portion 135 having an opening 145 formed therein. The actuator 140 is disposed in the opening 145 such that a force impinging upon the second region 143 is transferred by the actuator 140 to a portion of the MEMS sensing element 130 adjacent the first region 141. The singulated second wafer portion 135 can function as a cap with respect to the MEMS sensing element 130. Note that reference numeral 135 as utilized herein can refer to both the cap and the singulated second wafer portion. The singulated second wafer portion 135 thus includes opening 145 therethrough, such that the singulated second wafer portion or cap 135 is bonded to the singulated first wafer portion or MEMS sensing element 130, and disposed such that the actuator 140 is preferably laterally circumscribed by the opening 145.

The singulated second wafer portion 135 is preferably bonded to the singulated first wafer portion 130 with a bond 150 such as, for example, a glass frit bond, an anodic bond and/or an adhesive bond. The cap or singulated second wafer portion 135 may be configured from a rigid material such as silicon or glass. The MEMS force sensing element 130 can be attached to the substrate 110 with the assistance of a die-attach material 155. The MEMS force sensing element 130 can be further configured to measure an external force applied to a diaphragm 165 and provide an output signal representative of the applied force.

The MEMS force sensing element 130 can be formed from, for example, silicon with one or more piezoresistive regions arranged on or near the diaphragm 165 in a resistive bridge network arrangement. It can be appreciated, of course, that other types of pressure sensitive devices, or other force sensitive components, can be employed in addition to or in lieu of piezo-resistive elements, depending on design considerations and goals.

The apparatus 100 further includes a cap 135 with an opening 145 formed therein (e.g., a spherical-shaped hole or other appropriate shape) and is operably coupled to the MEMS force sensing element 130 via a bond 150. The bond 150 can be formed utilizing standard wafer-bonding processes such as glass fit bonding or anodic bonding or alternatively, an adhesive bond between the sense element 130 and the cap 135. Note that the cap 135 is depicted in FIG. 1 for illustrative purposes as a "top cap" in a top-side attachment arrangement. It can be appreciated, however, that a back-side configuration is equally possible.

An actuator 140 can be inserted in the opening 145 associated with the cap 135 in order to transfer force to the sense element 130 in response to receiving force from an external source. Note that the actuator 140 may comprise a spherical object such as, for example, a metallic ball bearing disposed in the opening 145 formed in the cap 135 and in contact with the force sense element 130. It can be appreciated that other types of actuators may be utilized such as, for example, slidable mounted plungers or shafts or point contact type components other than spherical objects, in accordance with alternative embodiments. The actuator 140 can be retained in the opening 145 associated with the cap 135.

The MEMS force sensing element 130 can be configured to sense an applied force via the actuator 140 and to generate an output signal representing the force. The cap 135 in association with the actuator 140 provides a uniform application of force with respect to the sense element 130. Thus, repeatability of the force sensor apparatus 100 can be achieved by restricting the actuator 140. For example, assuming that the actuator 140 is implemented as a metal ball bearing, if such a ball were free to move to the left, for example, the ball would contact a different location on the diaphragm 165, and with same level of force, the diaphragm would deflect by a different amount.

The disclosed embodiments can be utilized to maintain the actuator 140 in a more confined location by bonding the cap 135 to the force sense element 130 and configuring the opening 145 with precise dimensions with respect to the actuator 140. Additionally, the cap 135 is preferably configured from a rigid material or a substantially rigid material. Such a configuration prevents variability at the contact point of the actuator and with less compliance in structure versus when the actuator is confined by other approaches.

The bond pads 115 and 125 associated with the substrate 110 and the MEMS force sensing element 130 can be electrically connected via a wire bond connection 120. The wire bond connection 120 between the sense element 130 and the substrate 110 provides a stable, robust, and repeatable electrical connection. It can be appreciated, however, that other electrical connections such as conductive elastomer preforms, conductive adhesives, and anisotropic conductive adhesives are equally possible.

Figure 2:
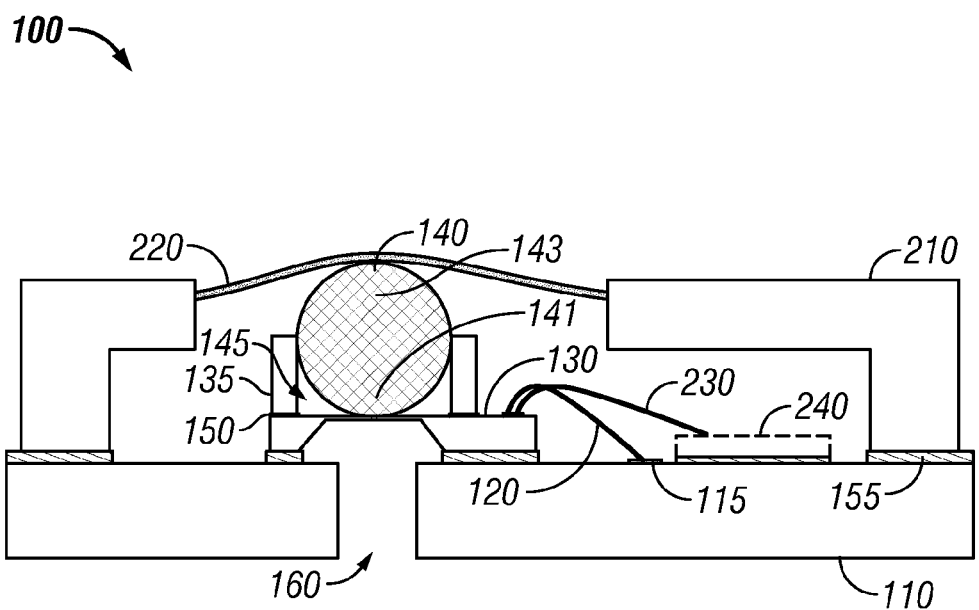
FIG. 2 illustrates a perspective view of a force sensor apparatus associated with a cover, in accordance with an embodiment.

FIG. 2 illustrates a perspective view of the force sensor apparatus 100 associated with a cover 210, in accordance with an alternative embodiment. Note that in FIGS. 1-3, identical or similar parts or elements are generally indicated by identical reference numerals. As depicted in FIG. 2, a flexible membrane 220 may be disposed adjacent and over the second region 143 of the actuator 140. The flexible membrane 220 isolates the spherical actuator 140, the opening 145, and the MEMS force sensing element 130 from an external region from which originates a force that impinges upon the second region 143. The flexible membrane 220 may be tensioned to bias the actuator 140 against the MEMS force sensing element 130. In general, the electrical characteristic of the MEMS force sensing element 130 changes in response to the force impinging upon the second region 143. This is an important consideration for implementing signal conditioning circuitry 240, which is discussed in greater detail below.

The cover 210 can be mounted on the substrate 110 utilizing an adhesive 155. The flexible membrane 220 can be configured from a flexible sheet that is essentially "pulled over" the top of the actuator 140. The cover 210 can be configured from a material such as, for example, a thermoset material, depending upon design considerations.

The flexible membrane 220 associated with the cover 210 can be configured from a thin layer of material (e.g., Kapton™, depending upon design considerations) and integrated with the cover 210 by any number of processes such as, for example, molding, adhesive bonding, and welding. It can be appreciated, of course, that other types of processes may be utilized in place of the suggested processes, depending on design considerations.

In an embodiment, the integrated membrane 220 further can retain the actuator 140 and provide a small "pre-load" to ensure repeatability, accurate response at low force, and reduced mechanical impact on the force sense element 130, which may otherwise occur as a result of force cycling. The flexible membrane 220 may be tensioned to bias the actuator 140 against the MEMS force sensing element 130.

Note that the height of the singulated second wafer portion 135 is preferably greater than or equal to the diameter of the actuator 140. It can be appreciated, however, that the singulated second wafer portion 135 may also be shorter, which still prevents lateral movement of the actuator 140. Further retention may be provided by the cover 210 associated with the integrated membrane 220.

It can be appreciated that environmental sealing and retaining function can also be provided by methods other than the integrated membrane such as, for example, adhesive or elastomeric sealing between cover 210 and actuator 140 and/or the singulated second wafer portion 135.

A signal conditioner 240, which is preferably an ASIC (Application Specific Integrated Circuit), can also be mounted on the substrate 110 for conditioning (e.g., transmitting, amplifying and/or compensating) the output signal. The signal conditioner 240 can be electrically coupled directly to the MEMS force sensing element 130 via the wire bond 230. The electrical characteristic of the MEMS force sensing element 130 changes in response to the force impinging upon the second region 143. The signal conditioner 240 thus includes circuitry that detects the change in the electrical characteristic and generates in response, an output signal whose magnitude is representative of a magnitude of the force. The signal conditioner 240 can condition the output signal to correct for repeatable variations, such as offset, sensitivity, non-linearity, and temperature effects. The signal conditioner 240 (e.g., signal conditioning circuitry) generally conditions the output signal to compensate for temperature-dependent variations in the electrical characteristic and/or to account for a nonlinear relationship between changes in the electrical characteristic and corresponding changes in the magnitude of the force.

Figure 3:
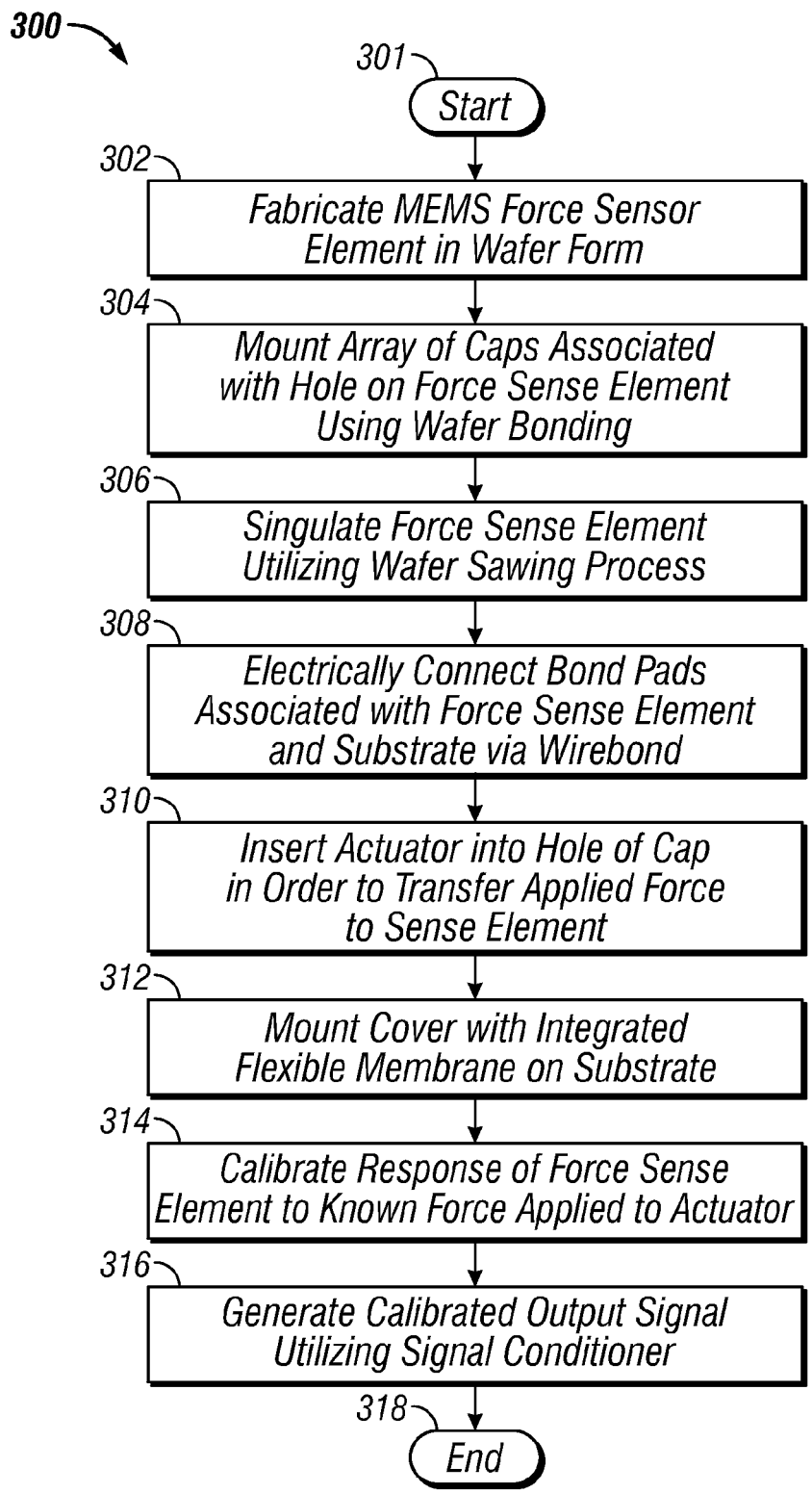
FIG. 3 illustrates a high level flow chart of operation illustrating logical operational steps of a method for assembling the force sensor apparatus, which can be implemented in accordance with an embodiment.

FIG. 3 illustrates a high level flow chart of operation illustrating logical operational steps of a method 300 for assembling the force sensor apparatus 100, in accordance with an embodiment. The process generally begins, as indicated at block 301. Thereafter, as illustrated at block 302, the MEMS force sensing element 130 (i.e. first singulated wafer portion) can be fabricated in wafer form using standard MEMS processes known in the art. Next, as depicted at block 304, the cap 135 (i.e., second singulated wafer portion) associated with the circular opening 145 can be mounted on the MEMS force sensing element 130 in wafer form using a wafer bonding operation. Then, as depicted at block 306, the MEMS force sensing element 130 can be singulated via a wafer sawing process. Thereafter, as indicated at block 308, the bond pads 125 and 115 associated with the force element 130 can be electrically connected to the substrate 110 via one or more wirebonds, such as, wirebond 120.

Next, as depicted at block 310, the actuator 140 can be inserted into the opening 145 of the cap 135 in order to assist in transferring an applied force to the force sense element 130. Then, as illustrated at block 312, the cover 210 can be mounted with the integrated flexible membrane 220 on the substrate 110 in order to protect and retain components associated with the force sensor apparatus 100. Next, as shown at block 314, the response of the MEMS force sensing element 130 can be calibrated to a known force applied to the actuator 140. Thereafter, as indicated at block 316, a calibrated output signal can be generated utilizing a signal conditioner.240

The force sensor apparatus 100 provides fast response time, repeatable signal, and high reliability of mechanical and electrical connections associated with the force sensor apparatus. Various alterations and modifications will occur to those skilled in the art from the foregoing detailed description of the invention and the accompanying drawings.

It will also be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A force sensor comprising:
a singulated first wafer portion configured to form a MEMS force sensing element;
a substantially spherical actuator having a first region adjacent said MEMS force sensing element and a second region that is opposite said first region, wherein said substantially spherical actuator is disposed such that a force impinging upon said second region is transferred by said substantially spherical actuator to a portion of said MEMS force sensing element adjacent said first region; and
a singulated second wafer portion defining a cap having an opening extending therethrough, the singulated second wafer portion bonded to said singulated first wafer portion, and disposed such that said substantially spherical actuator extends into said opening and is laterally circumscribed by said singulated second wafer portion.

2. The force sensor of claim 1, wherein said singulated second wafer portion is bonded directly to said singulated first wafer portion with a bond selected from a group comprising a glass frit bond, an anodic bond, and an adhesive bond.

3. The force sensor of claim 1, further comprising a flexible membrane disposed adjacent and over said second region of said substantially spherical actuator.

4. The force sensor of claim 3, wherein said flexible membrane isolates said substantially spherical actuator, said opening, and said MEMS force sensing element from an external region from which originates said force that impinges upon said second region of said substantially spherical actuator.

5. The force sensor of claim 3, wherein said flexible membrane is tensioned to bias said substantially spherical actuator against said MEMS force sensing element.

6. The force sensor of claim 1, wherein an electrical characteristic of said MEMS force sensing element changes in response to said force impinging upon said second region of said substantially spherical actuator.

7. The force sensor of claim 6, further comprising circuitry that detects a change in said electrical characteristic and generates in response, an output signal whose magnitude is representative of a magnitude of said force.

8. The force sensor of claim 7, further comprising signal conditioning circuitry that conditions said output signal to compensate for temperature-dependent variations in said electrical characteristic.

9. The force sensor of claim 8, further comprising a wire bond that electrically couples said MEMS force sensing element to said signal conditioning circuitry.

10. The force sensor of claim 7, further comprising signal conditioning circuitry that conditions said output signal to account for a nonlinear relationship between changes in said electrical characteristic and corresponds to changes in said magnitude of said force.

11. A force sensor comprising:
a singulated first wafer portion configured to form a MEMS force sensing element;
an actuator having a first region adjacent said MEMS force sensing element and a second region that is opposite said first region, wherein said actuator is disposed such that a force impinging upon said second region is transferred by said actuator to a portion of said MEMS force sensing element adjacent said first region; and
a singulated second wafer portion having an opening extending therethrough, bonded to said singulated first wafer portion, and disposed such that said actuator extends into said opening and is circumscribed by said singulated first wafer portion.

12. The force sensor of claim 11 wherein said actuator comprises at least one of the following types of actuators:
a spherical shaped actuator;
a rectangular shaped actuator;
a slidably mounted plunger;
a slidably mounted shaft; and
a point contact type component.

13. The force sensor of claim 11 wherein said singulated second wafer portion is bonded directly to said singulated first wafer portion with a bond selected from said group comprising a glass frit bond, an anodic bond, and an adhesive bond.

14. The force sensor of claim 11 further comprising a flexible membrane disposed adjacent and over said second region of said actuator, wherein said flexible membrane isolates said actuator, said opening, and said MEMS force sensing element from an external region from which originates said force that impinges upon said second region of said actuator.

15. The force sensor of claim 11 further comprising a flexible membrane disposed adjacent and over said second region of said actuator, wherein said flexible membrane is tensioned to bias said actuator against said MEMS force sensing element.

16. A method of forming a force sensor, said method comprising:
fabricating a first wafer to include a plurality of MEMS force sensing elements formed therein, and a second wafer with a plurality of openings;
bonding said first wafer to said second wafer, with the plurality of openings in registration with the plurality of MEMS force sensing elements;
after bonding said first wafer to said second wafer, singulating said bonded first and second wafers into individual force sensing assemblies;
inserting a rigid actuator into the opening of one of the force sensing assemblies; and
providing a flexible membrane adjacent and over said actuator and said opening.

17. The method of claim 16 further comprising:
disposing said actuator such that a force impinging upon a first side of said actuator through the flexible membrane is transferred by said actuator to said MEMS force sensing element.

18. The method of claim 17 further comprising configuring said actuator to comprise at least one of the following types of actuators:
a spherical shaped actuator;
a rectangular shaped actuator;
a slidably mounted plunger;
a slidably mounted shaft; and
a point contact type component.

19. The method of claim 16 wherein said actuator extends into said opening and is laterally circumscribed by said force sensing assembly.

20. The force sensor of claim 19 further comprising:
configuring said flexible membrane to isolate said actuator, said opening and said corresponding MEMS force sensing element from an external region from which originates said force that impinges upon said actuator through said flexible membrane; and
tensioning said flexible membrane to bias said actuator against said corresponding MEMS force sensing element.

21. A force sensor, comprising:
a first wafer portion defining a MEMS force sensing element;
a second wafer portion bonded to the first wafer portion and forming an opening adjacent to the MEMS force sensing element;
an actuator extending into said opening and laterally circumscribed by the second wafer portion, the actuator having a first region adjacent to the MEMS force sensing element, the actuator having a second region opposite the first region, wherein a longitudinal force against the second region of the actuator transfers through the first region of the actuator to the MEMS force sensing element; and
a flexible membrane adjacent to the second region of the actuator that retains the actuator within the second wafer portion.

22. The force sensor of claim 21, wherein the flexible membrane is tensioned to bias the actuator against the MEMS force sensing element.

* * * * *